United States Patent
Seckin et al.

(10) Patent No.: US 9,425,835 B2
(45) Date of Patent: Aug. 23, 2016

(54) TRANSMITTER WITH REDUCED COUNTER-INTERMODULATION

(71) Applicant: Broadcom Corporation, Irvine, CA (US)

(72) Inventors: Utku Seckin, San Diego, CA (US); Ali Afsahi, San Diego, CA (US); Ali Sarfaraz, Alamo, CA (US)

(73) Assignee: Broadcom Corporation, Irvine, CA (US)

( * ) Notice: Subject to any disclaimer, the term of this patent is extended or adjusted under 35 U.S.C. 154(b) by 62 days.

(21) Appl. No.: 14/012,284

(22) Filed: Aug. 28, 2013

(65) Prior Publication Data

US 2015/0044979 A1 Feb. 12, 2015

Related U.S. Application Data

(60) Provisional application No. 61/864,163, filed on Aug. 9, 2013.

(51) Int. Cl.
*H04B 1/04* (2006.01)
*H03D 7/14* (2006.01)
*H03D 7/16* (2006.01)

(52) U.S. Cl.
CPC ........... *H04B 1/0475* (2013.01); *H03D 7/1458* (2013.01); *H03D 7/1483* (2013.01); *H03D 7/165* (2013.01)

(58) Field of Classification Search
CPC .... H03H 2/006; H04B 1/0458; H04B 1/0475; H04B 1/525; H03K 5/1252
USPC ............. 455/570, 114.1, 114.2; 327/551–563
See application file for complete search history.

(56) References Cited

U.S. PATENT DOCUMENTS

| | | | | | |
|---|---|---|---|---|---|
| 5,477,204 | A | * | 12/1995 | Li | H01F 17/0006 336/200 |
| 7,003,275 | B1 | * | 2/2006 | Petrovic | H03D 7/161 455/114.3 |
| 7,199,679 | B2 | * | 4/2007 | Mondal | H03H 7/42 333/25 |
| 7,912,210 | B2 | * | 3/2011 | Fuehrer | H04L 25/0266 379/399.01 |
| 8,095,082 | B2 | * | 1/2012 | Deng | H04B 1/0067 455/118 |
| 8,107,906 | B2 | * | 1/2012 | Lum | H04B 7/0845 375/346 |
| 8,270,917 | B2 | * | 9/2012 | Embabi | H03G 1/04 455/115.1 |
| 8,428,545 | B1 | * | 4/2013 | Kaunisto | H03H 11/126 333/172 |
| 8,502,596 | B1 | * | 8/2013 | Kaunisto | H03H 7/0153 327/553 |

(Continued)

OTHER PUBLICATIONS

Mark Ingels et al., A Multiband 40nm CMOS LTE Saw-Less Modulator with -60dBc C-IM3, ISSCC 2013, Session 19, Wireless Transceivers for Smart Devices, 19.6, 3pp., 2013 IEEE International Solid-States Circuits Conference.

(Continued)

*Primary Examiner* — Edward Urban
*Assistant Examiner* — Rui Hu
(74) *Attorney, Agent, or Firm* — Brinks Gilson & Lione (57) ABSTRACT

A mixer for a transmitter includes a voltage converter to convert a baseband voltage to a baseband current. A mixer component mixes the baseband current with a local oscillator frequency. An output of the mixer component includes a radio frequency signal and a higher order radio frequency signal. A coupler sends the radio frequency signal and the higher order radio frequency signal to a differential output. A filter is integrated into the coupler to filter the higher order radio frequency signal before being output by the differential output.

20 Claims, 6 Drawing Sheets

(56) References Cited

U.S. PATENT DOCUMENTS

| | | | | |
|---|---|---|---|---|
| 8,655,299 B2* | 2/2014 | Mirzaei | H04B 1/006 | 375/343 |
| 8,786,381 B2* | 7/2014 | Kimball | H01F 27/2804 | 333/238 |
| 8,913,968 B2* | 12/2014 | Mirzaei | H04B 1/0475 | 455/114.1 |
| 2005/0075083 A1* | 4/2005 | Cairo | H03F 3/45085 | 455/120 |
| 2009/0163156 A1* | 6/2009 | Rofougaran | H03C 5/00 | 455/127.1 |
| 2009/0195303 A1* | 8/2009 | Bowhers | H02M 7/48 | 327/551 |
| 2009/0291652 A1* | 11/2009 | Takemura | H03H 7/01 | 455/118 |
| 2010/0120369 A1* | 5/2010 | Ko | H04B 1/40 | 455/67.11 |
| 2010/0248660 A1* | 9/2010 | Bavisi | H04B 1/0458 | 455/120 |
| 2010/0329157 A1* | 12/2010 | Xing | H03F 1/3211 | 370/278 |
| 2011/0187458 A1* | 8/2011 | Kim | H03F 3/68 | 330/295 |
| 2011/0212692 A1* | 9/2011 | Hahn | H04B 1/525 | 455/63.1 |
| 2012/0013387 A1* | 1/2012 | Sankaranarayanan | H03H 7/422 | 327/355 |
| 2012/0052824 A1* | 3/2012 | Mirzaei | H03F 3/245 | 455/127.2 |
| 2012/0063496 A1* | 3/2012 | Giannini | H04B 1/0475 | 375/221 |
| 2012/0269307 A1* | 10/2012 | Ozgun | H04B 1/1036 | 375/350 |
| 2013/0314288 A1* | 11/2013 | Tayrani | G01S 7/032 | 343/786 |
| 2014/0028406 A1* | 1/2014 | Cao | H03B 5/1215 | 331/117 FE |
| 2014/0051374 A1* | 2/2014 | Oliaei | H03F 3/16 | 455/127.2 |
| 2014/0140455 A1* | 5/2014 | Mirzaei | H04B 1/006 | 375/350 |
| 2014/0159933 A1* | 6/2014 | Dufrene | H03M 1/0612 | 341/144 |
| 2014/0169237 A1* | 6/2014 | Furuta | H04L 5/143 | 370/278 |
| 2014/0184356 A1* | 7/2014 | Kihara | H01L 27/016 | 333/174 |
| 2014/0253216 A1* | 9/2014 | Soe | H03D 7/1441 | 327/357 |
| 2014/0266506 A1* | 9/2014 | Andersson | H01F 27/42 | 333/177 |
| 2014/0266531 A1* | 9/2014 | Leipold | H03F 3/195 | 336/170 |
| 2014/0314132 A1* | 10/2014 | Leuschner | H04B 5/0075 | 375/224 |
| 2014/0347142 A1* | 11/2014 | Chang | H03H 7/0184 | 333/25 |
| 2015/0050901 A1* | 2/2015 | Lee | H03F 1/0277 | 455/127.3 |
| 2015/0117280 A1* | 4/2015 | Khlat | H04B 1/50 | 370/297 |

OTHER PUBLICATIONS

Takao Kihara et al., A Multiband LTE SAW-Less CMOS Transmitter with Source-Follower-Driven Passive Mixers, Envelope-Tracked RF-PGAs, and Marchand Baluns, 4pp., 2012 IEEE Radio Frequency Integrated Circuits Symposium.

Ahmad Mirzaei et al., Analysis of Direct-Conversion IQ Transmitters with 25% Duty-Cycle Passive Mixers, 14pp., IEEE Transactions on Circuits and Systems-1: Regular Papers, vol. 58, No. 10, Oct. 2011.

Omid Oliaei et al., A Multiband Multimode Transmitter without Driver Amplifier, 3pp., ISSCC 2012, Session 9, Wireless Transceiver Techniques, 9.2, 2012 IEEE International Solid-State Circuits Conference.

* cited by examiner

TRANSMITTER WITH REDUCED COUNTER-INTERMODULATION

PRIORITY CLAIM

This application claims priority to U.S. Provisional Application Ser. No. 61/864,163, filed Aug. 9, 2013, which is incorporated herein by reference in its entirety.

TECHNICAL FIELD

This disclosure relates to transmitters. This disclosure also relates to transmitters with a reduced counter-intermodulation component.

BACKGROUND

A transmitter or radio transmitter in electronics and telecommunications is an electronic device which with an antenna produces radio waves. The transmitter can generate a radio frequency alternating current, which can be applied to the antenna. When excited by the alternating current the antenna can radiate radio waves. The transmitter can be used in equipment that generates radio waves for communication purposes and radiolocation, such as radar and navigational transmitters.

BRIEF DESCRIPTION OF THE DRAWINGS

The innovation may be better understood with reference to the falling drawings and description. In the figures, like reference numerals designate corresponding parts throughout the different views.

DETAILED DESCRIPTION

Radio transmitters can minimize undesired out-of-band transmission to avoid interfering with other radio equipment. Standards, such as the 3rd Generation Partnership Project Long Term Evolution (3GPP-LTE) standards, present increasingly strict requirements to minimize undesired out-of-band transmissions. One example of undesired out-of-band transmissions is the transmitting of unwanted signals in channels or bands neighboring the channel/band being used to transmit the intended signal. Transmissions in such neighboring channels may be caused by intermodulation in elements within the transmitting chain. Intermodulation can occur when nonlinearities in a given circuit element cause two input signals of different frequencies to be undesirably combined. Intermodulation can create additional signals at frequencies which are at the sum and/or difference of integer multiples of the input frequencies.

In accordance with the circuits and methods described herein, lower power consumption can be achieved by eliminating extra power needed to reduce a third-order counter intermodulation C-IM3 and/or by enabling a power amplifier (PA) to be biased into class-B.

Figure 1:
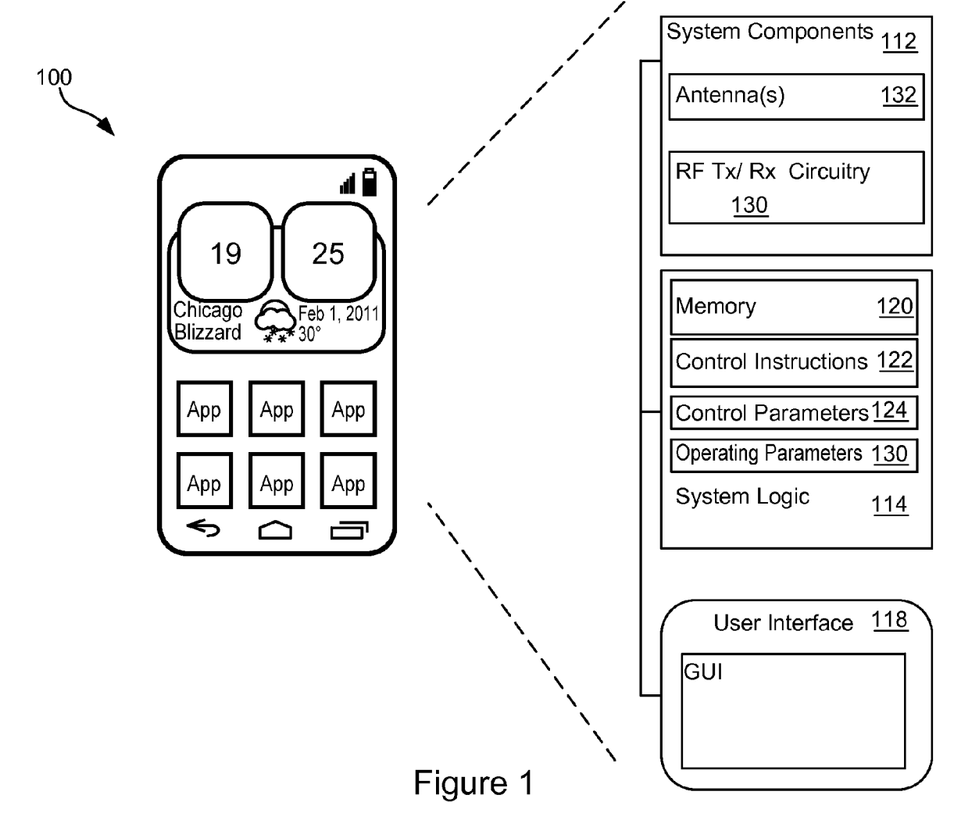
FIG. 1 shows an example of user equipment that includes an analog to digital converter.

FIG. 1 shows an example of user equipment (UE) 100 the can implement the described receiver architectures. User equipment may take many different forms and have many different functions. As one example, user equipment may be a 2G, 3G, or 4G/LTE cellular phone capable of making and receiving wireless phone calls, and transmitting and receiving data. The user equipment 100 may also be a smartphone that, in addition to making and receiving phone calls, runs any number or type of applications. The user equipment 100 may as take the form of a wired device.

User equipment 100 may be virtually any device that transmits and receives information, including as additional examples a driver assistance module in a vehicle, an emergency transponder, a pager, a satellite television receiver, a networked stereo receiver, a computer system, music player, or virtually any other device. The techniques discussed below may also be implemented in a base station or other network controller that communicates with the user equipment (UE).

The user equipment 100 can include among other things system components 112, system logic 114 and a user interface 118. System logic 114 can be part of the implementation of desired functionality in the UE 100. In that regard, the system logic 114 may include logic that facilitates, as examples, running applications; accepting user inputs; saving and retrieving application data; establishing, maintaining, and terminating cellular phone calls or data connections for, as one example, Internet connectivity; establishing, maintaining, and terminating wireless network connections, Bluetooth connections, or other connections; and displaying relevant information on the user interface 118. The user interface 118 may include a graphical user interface (GUI), touch sensitive display, voice, facial and gesture recognition inputs, buttons, switches, speakers and other user interface elements.

The system logic 114 can include memory 120, control instructions 122, control parameters 124 and operating parameters 130. The system components 112 may be implemented, for example, in a system on a chip (SoC), application specific integrated circuit (ASIC), or other circuitry. In the system components 112 a communication interface can include Radio Frequency (RF) transmit (Tx) and receive (Rx) circuitry 130 to handle transmission and reception of signals through one or more antennas 132.

As implementation examples, the system components 112 may include BCM4345, BCM4349 or BCM4343 wireless local area network (WLAN) chips or combo chips. These devices or other similar system solutions may be extended to provide the additional functionality described below. These integrated circuits, as well as other hardware and software implementation options for the user equipment 100, are available from Broadcom Corporation of Irvine Calif.

The transmitted and received signals may adhere to any of a diverse array of formats, protocols, modulations (e.g., QPSK, 16-QAM, 64-QAM, or 256-QAM), frequency channels, bit rates, and encodings. As one example, the system components 112 may support transmission and reception under multiple protocols. For example, WLAN, ANT, Bluetooth, and Bluetooth Low Energy (BLE) standards. Corresponding protocol stacks may be included in the memory 120. The techniques described below, however, are applicable to other communications technologies.

Figure 2:
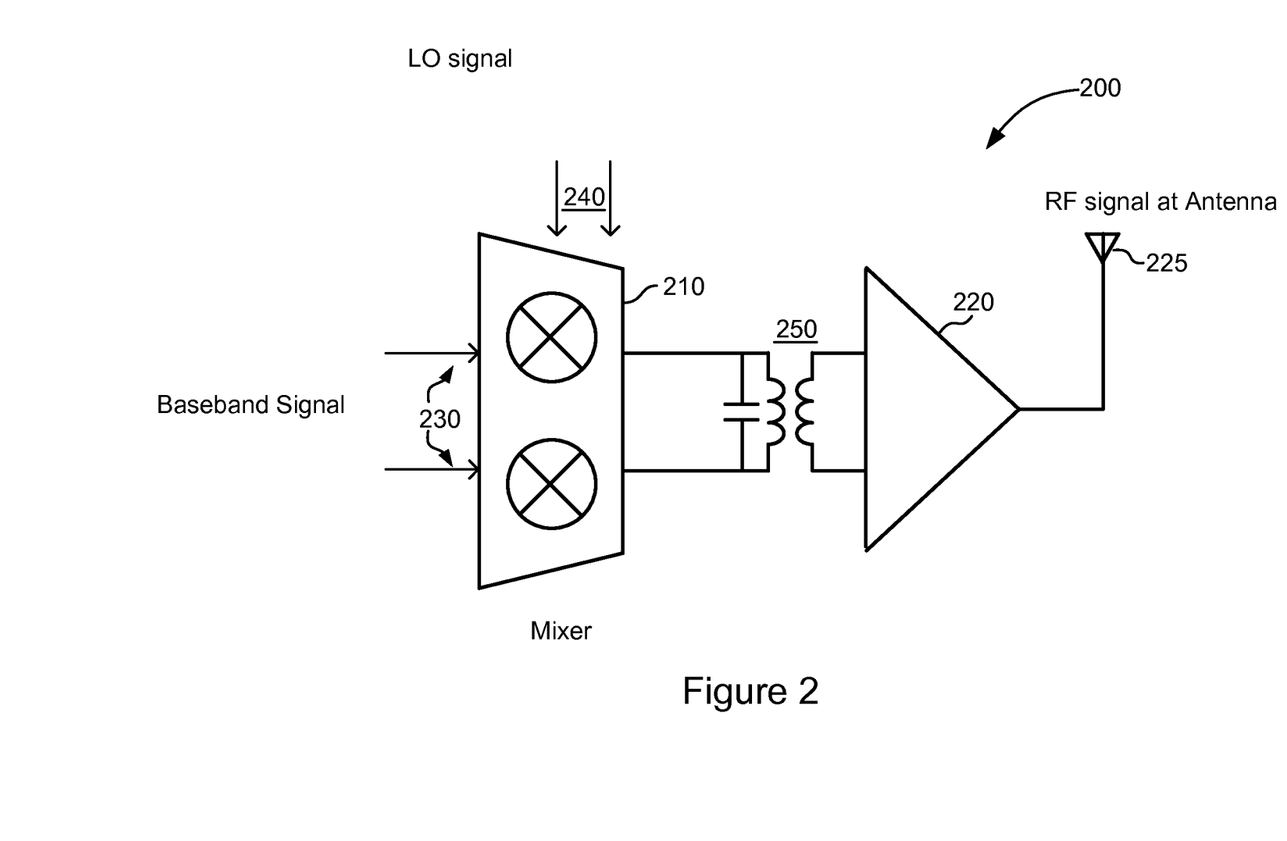
FIG. 2 is a circuit diagram of an exemplary transmitter circuit.

FIG. 2 is a block diagram of an exemplary transmitter circuit 200. The circuit 200 can include a mixer 210 for sending a baseband signal mixed with a local oscillator (LO) signal to a power amplifier (PA) 220. The baseband signal can enter the mixer 210 at baseband inputs 230. The LO signal to upconvert with the baseband signal can enter the mixer 210 at LO inputs 240. The LO signal contains signal components at LO, 3O, 5LO, etc. The PA 220 can be on the same chip as the mixer 210, or off chip. The PA 220 can connect with an antenna 225 to transmit RF signals from the mixer 210.

Figure 3:
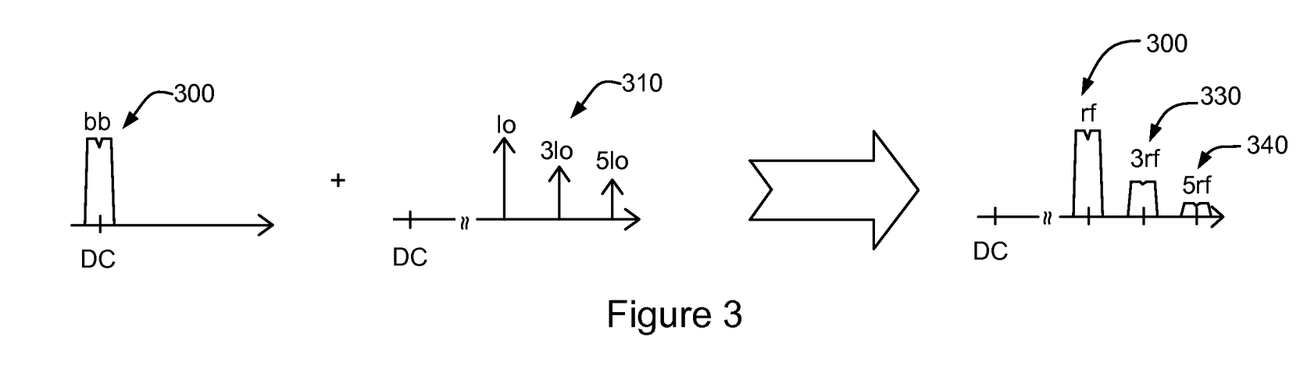
FIG. 3 is an exemplary diagram of the baseband signal being mixed with the signal.

FIG. 3 is an exemplary diagram of the baseband signal 300 being upconverted by the mixer 210 with the LO signals 310, e.g., lo, 3lo, 5lo, etc. Referring to FIGS. 2 and 3, the baseband signal 300 may be mixed with the LO signals 310 to produce a radio frequency (rf) signal 320, a 3rf signal 330 and a 5rf signal 340, etc. Frequencies other than the radio frequency may also be used. The 3rf may cause a third-order counter intermodulation (C-IM3) component to be generated in the power amplifier PA 220 e.g., a programmable gain amplifier (PGA). Some solutions to address counter-intermodulation involve adding passive components which can require a large circuit area or requiring high-linearity radio frequency (RF) amplifiers, which can reduce transmitter efficiency.

To combat counter-intermodulation with a reduced circuit area and/or increased efficiency over other solutions, an inductor/capacitor (LC) or other notch filter incorporated into transformer 250, e.g., balun, can be added at the output of the mixer 210 before the mixer output is sent to the PA 220, or other non-linear block of circuitry. When the upconverted 3rf 330 signal is inputted to a non-linear block, it can create distortion which degrades a quality of the rf signal 320. Therefore, the notch filter located in transformer 250 can be used to filter the third harmonic up-converted component 3rf 330 to reduce the distortion to the rf signal 320. Additionally or alternatively, other filters can be implemented, e.g. to filter 5rf 340, etc. The notch filter can be integrated inside an already existing mixer balun, e.g., any passive structure in the RF domain, to not consume any additional circuit area. By placing the notch filter inside the mixer balun, an integrated design can offer not only area savings but also accurate design modeling and capture of circuit performance factors.

As described in more detail below, in addition to the notch filter in transformer 250, a differential capacitor at the source of mixer cascode devices can filter out 3rf in the current domain. The additional area can be a single metal capacitor which is negligible compared to the rest of the circuit area. With these, the PA 220 can be biased in class-B and achieve a low C-IM3 and high efficiency.

Figure 4:
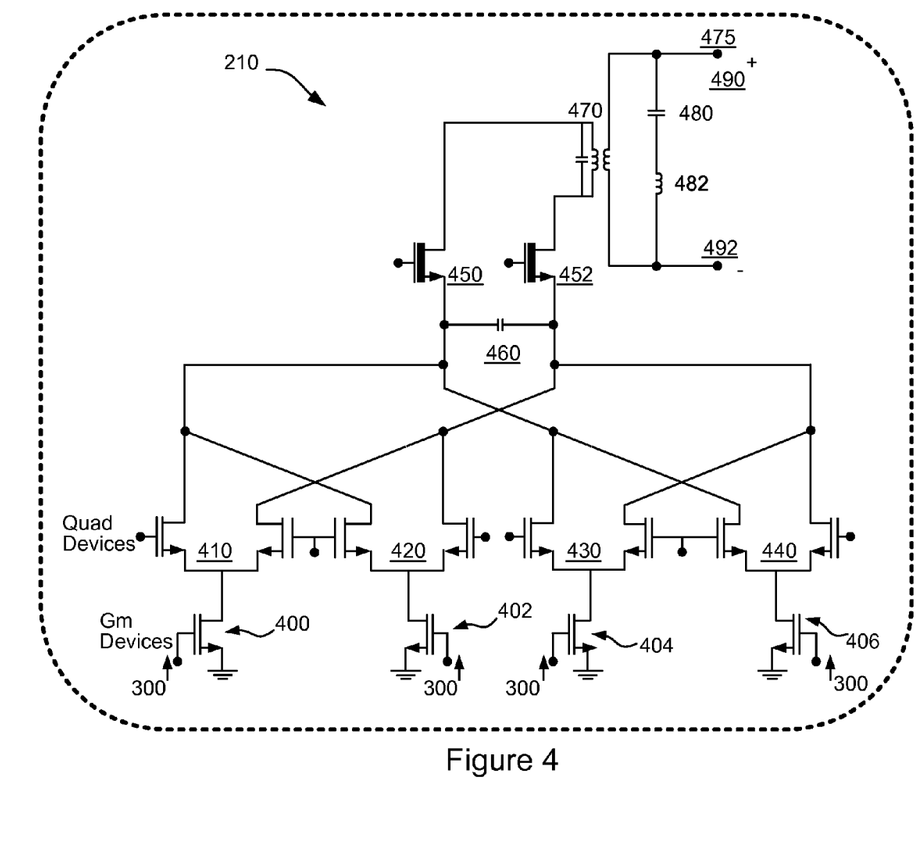
FIG. 4 is a more detailed circuit diagram of the exemplary transmitter circuit 200 of FIG. 2.

FIG. 4 is a more detailed circuit diagram of the exemplary mixer 210 of FIG. 2. The transistors 400, 402, 404, 406 are operating as Gm devices, e.g., voltage converters, to receive the baseband signal 300 and convert the baseband signal 300 to current. An exemplary frequency of the baseband signal 300 is from about 1 to about 20 Mhz. The current outputted from the Gm devices is fed to the quad devices 410, 420, 430, 440 or other mixer component. The quad transistor devices 410, 420, 430, 440 mix the LO signals 310 with the baseband signal 300 to create an rf signal. The quad devices 410, 420, 430, 440 output the rf signal 330 to be sent to the PA 220 for transmission. Before reaching the PA 220, cascode transistors 450, 452 can be used for gain control and/or to protect the quad devices 410, 420, 430, 440 and Gm device transistors 400, 402, 404, 406 from high supply voltages, e.g., about 3.3 volts.

A capacitor 460 shunts the cascode transistors 450, 452 and acts as a Gm/C filter to initially filter the 3rf signal 330, or other signal depending on a tuning of the filter. The size of the capacitor 460 is determined to be not large enough to filter the rf signal 330 but large enough to filter at least some of the 3lo signal 320. The outputs of the cascode transistors 450, 452 connect with a coupler 470, e.g., balun transformer 250. The coupler 470 can include inductors and a capacitor to couple the rf signal 320 with a differential output 475. A capacitor 480 and inductor 482 are integrated with the coupler 470 and the capacitor 480 and inductor 482 are connected in series between output lines 490, 492 of the differential output 475 of the coupler 470. The capacitor 480 and the inductor 482 can connect in parallel with the coupler 470, e.g., connect with the differential outputs of the balun transformer 250. The series capacitor 480 and inductor 482 are tuned to filter 3rf or other unwanted frequency. The series capacitor 480 and inductor 482 can create a short circuit at 310 between the differential output lines 490, 492, and an open circuit at the rf frequency. The output lines 490, 492 can connect with the PA 220.

Figure 5:
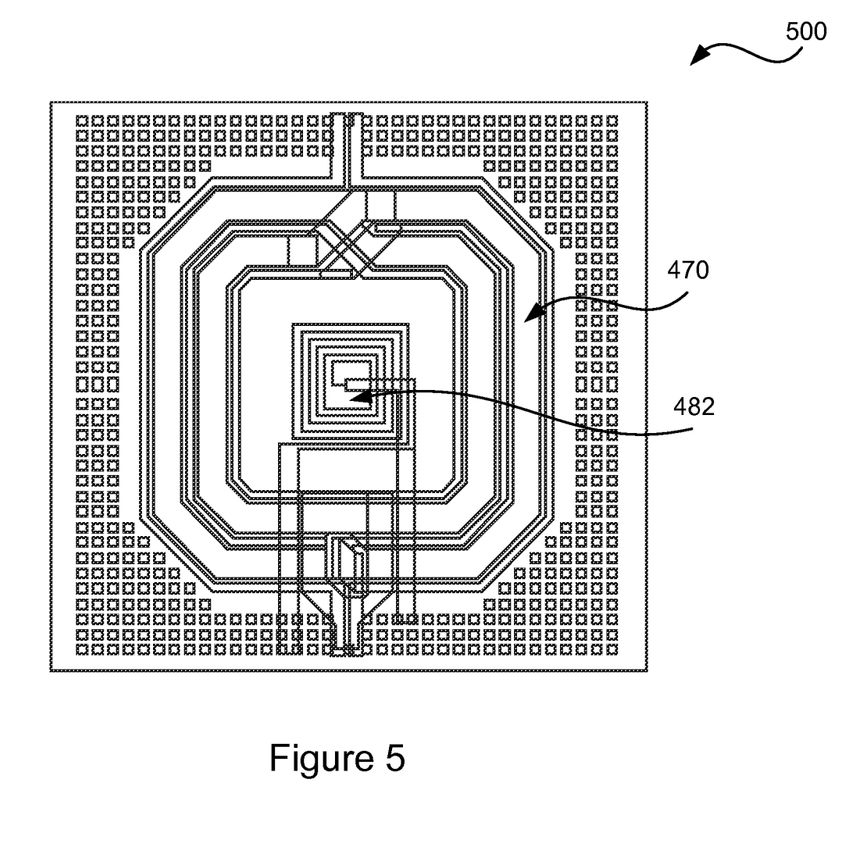
FIG. 5 is an exemplary circuit layout of the inductors of FIG. 4.

FIG. 5 is an exemplary circuit layout 500 of the inductor of the coupler 470 and the third harmonic filter inductor 482 in FIG. 4. Since the third harmonic inductor 482 is positioned within the mixer inductor of the coupler 470, the third harmonic inductor 482 need not increase the size of a die area of the circuit layout 500.

Figure 6:
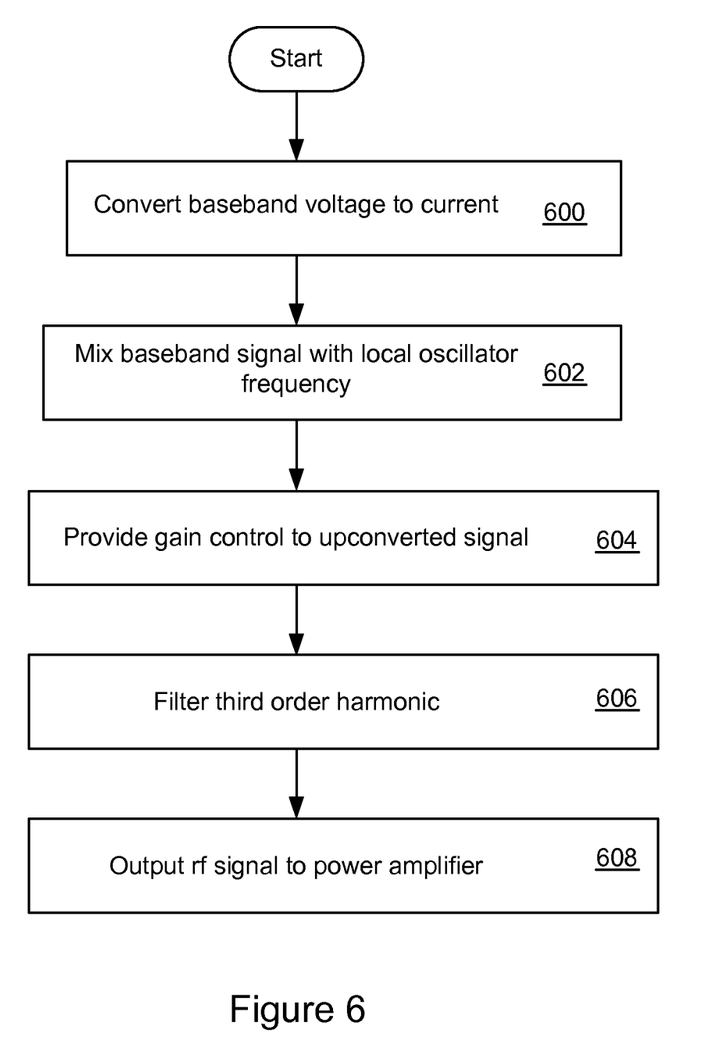
FIG. 6 is a flowchart of an exemplary logic for mixing a radio frequency signal with a local oscillator frequency.

FIG. 6 is a flowchart of an exemplary logic for a mixer to mix a radio frequency signal with a local oscillator frequency. A baseband voltage signal can be converted to a baseband current signal (600). The baseband current signal can be mixed with a local oscillator frequency signal to obtain a radio frequency signal and a higher order radio frequency signal (602). Gain control can be provided to the upconverted signal (604). The higher order radio frequency signal, e.g., third order frequency signal, can be filtered out before outputting the radio frequency signal to a non-linear block of circuitry (606). The filtering can occur, e.g., at the gain control or a balun transformer of the mixer. The balun transformer can output a differential rf signal to a next stage of the circuitry, e.g., a PA (608). Filtering out the higher order radio frequency signal can include shorting the higher frequency signal at the differential output.

The methods, devices, and logic described above may be implemented in many different ways in many different combinations of hardware, software or both hardware and software. For example, all or parts of the system may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. All or part of the logic described above may be implemented as instructions for execution by a processor, controller, or other processing device and may be stored in a tangible or non-transitory machine-readable or computer-readable medium such as flash memory, random access memory (RAM) or read only memory (ROM), erasable programmable read only memory (EPROM) or other machine-readable medium such as a compact disc read only memory (CDROM), or magnetic or optical disk. Thus, a product, such as a computer program product, may include a storage medium and computer readable instructions stored on the medium, which when executed in an endpoint, computer system, or other device, cause the device to perform operations according to any of the description above.

The processing capability of the system may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs may be parts (e.g., subroutines) of a single program, separate programs, distributed across several memories and processors, or implemented in many different ways, such as in a library, such as a shared library (e.g., a dynamic link library (DLL)). The DLL, for example, may store code that performs any of the system processing described above.

While various embodiments have been described, it can be apparent that many more embodiments and implementations are possible. Accordingly, the embodiments are not to be restricted.

What is claimed is:

1. A mixer for a transmitter, comprising:
   a voltage converter configured to convert a baseband voltage to a baseband current;
   a mixer component connected with the voltage converter, the mixer component configured to mix the baseband current with a local oscillator frequency, an output of the mixer component including a radio frequency signal and a higher order radio frequency signal;
   a coupler, comprising a balun transformer, connected with the mixer component, the coupler configured to send the radio frequency signal to a differential output having a positive output line and a negative output line;
   a filter integrated into the coupler, the filter being a notch filter comprising a capacitor and an inductor coupled in series between the positive output line and the negative output line of the differential output of the coupler to filter the higher order radio frequency signal before being sent by the coupler to the differential output; and
   a gain component and a filter component coupled to an input of the gain component, the gain component and the filter component being coupled to an input of the coupler between the mixer component and the coupler, the filter component comprising a differential capacitor coupled in parallel with the gain component to initially filter the higher order radio frequency signal in a current domain before being received by the coupler and subsequently filtered by the notch filter, and the gain component comprising cascode transistors, the differential capacitor being connected in parallel with the cascode transistors and another capacitor coupled across the input of the balun transformer.

2. The mixer of claim 1, where the higher order radio frequency signal comprises a third order radio frequency signal.

3. The mixer of claim 1, where the coupler includes a transformer inductor and the inductor of the filter is positioned within the transformer inductor on a die.

4. The mixer of claim 1, further comprising a class-B power amplifier connected with the coupler.

5. The mixer of claim 1, further comprising a filter component coupled to an input of the coupler between the mixer component and the coupler, wherein the higher order radio frequency signal comprises a third order up-converted radio frequency component and the filter component is configured to initially filter the higher order radio frequency signal to reduce a third order counter intermodulation component, and the notch filter is configured to subsequently filter the higher order radio frequency signal to further reduce the third order counter intermodulation component.

6. The mixer of claim 1, wherein the differential capacitor is a single metal capacitor.

7. The mixer of claim 1, wherein the differential capacitor is sized to filter at least some of higher order radio frequency signal without filtering the radio frequency signal.

8. The mixer of claim 1, wherein the capacitor and the inductor are tuned to filter the higher order radio frequency signal.

9. A system, comprising:
   a mixer component configured to mix a baseband current with a local oscillator frequency, an output of the mixer component including a radio frequency signal and a higher order radio frequency signal;
   a balun coupler connected with the mixer component, the balun coupler configured to send the radio frequency signal to a differential output of the balun coupler, the differential output having a positive terminal and a negative terminal, the balun coupler including a notch filter component integrated into the balun coupler, the notch filter component comprising a capacitor coupled in series with an inductor, wherein the capacitor in series with the inductor are coupled with the positive terminal and the negative terminal in parallel with the differential output to filter the higher order radio frequency signal before being output by the differential output: and
   a cascode transistor component and a second filter component connected with an input of the cascode transistor component, the cascode transistor component and the second filter component being coupled between the mixer component and the balun coupler, and the second filter component configured to initially filter the higher order radio frequency signal in a current domain before the balun coupler, and the notch filter component configured to subsequently filter the higher order radio frequency signal after the balun coupler, the second filter component comprising a differential capacitor connected in parallel with the cascode transistor component and another capacitor coupled in parallel with an input of the balun coupler.

10. The system of claim 9, where the higher order radio frequency signal comprises a third order radio frequency signal.

11. The system of claim 9, wherein the balun coupler includes a transformer inductor and the inductor of the notch filter component is positioned within the transformer inductor on a die.

12. The system of claim 9, wherein the balun coupler comprises a balun transformer.

13. The system of claim 9, wherein the capacitor and the inductor included in the notch filter component are tuned to filter the higher order radio frequency signal, but not the radio frequency signal.

14. The system of claim 9, wherein the capacitor and the inductor included in the notch filter component, and the differential capacitor included in the second filter component are tuned to filter the higher order radio frequency signal, but not the radio frequency signal.

15. The system of claim 9, wherein the cascode transistor component comprises a first transistor and a second transistor, and the differential capacitor is coupled between a source of the first transistor and a source of the second transistor.

16. A method of mixing a signal, comprising:
   converting a baseband voltage signal to a baseband current signal;
   mixing, with a mixer component, the baseband current signal with a local oscillator frequency signal to obtain an unconverted signal comprising a radio frequency signal and a higher order radio frequency signal;
   first filtering the unconverted signal output from the mixer component in a current domain at a cascode device coupled in parallel with a differential capacitor and another capacitor coupled across an input of a balun transformer to initially filter out the higher order radio frequency signal before input to the balun transformer; and filtering out the higher order radio frequency signal after the balun transformer by creating a short circuit of the higher order radio frequency signal at a differential output of a balun before outputting the radio frequency signal to a non-linear block of circuitry, the short circuit created by a notch filter integrated in the balun transformer, the notch filter comprising an inductor coupled in series with a capacitor, one of the inductor or the capacitor coupled with a positive output of the differential output and the other of the inductor or the capacitor coupled with a negative output of the differential output.

17. The method of claim 16, wherein filtering out the higher order radio frequency signal is performed with the notch filter integrated within the balun transformer.

18. The method of claim 16, wherein first filtering the upconverted signal output from the mixer component comprises filtering at least some of the higher order radio frequency signal with the differential capacitor without the differential capacitor filtering the radio frequency signal.

19. The method of claim 16, wherein first filtering the upconverted signal output from the mixer component comprises shunting the cascode device.

20. The method of claim 16, wherein first filtering the upconverted signal output from the mixer component further comprises gain controlling the upconverted signal with the cascode device.

\* \* \* \* \*